(12) United States Patent
Tsukahara et al.

(10) Patent No.: US 9,001,288 B2
(45) Date of Patent: Apr. 7, 2015

(54) COLOR CONVERTING MEMBER, METHOD OF MANUFACTURING THE SAME, LIGHT EMITTING DEVICE, AND DISPLAY DEVICE

(75) Inventors: Tsubasa Tsukahara, Tokyo (JP); Yasushi Ito, Kanagawa (JP); Naoji Nada, Kanagawa (JP); Yoshihiro Oshima, Kanagawa (JP); Hideya Chubachi, Kanagawa (JP)

(73) Assignee: Dexerials Corporation, Tokyo (JP)

( * ) Notice: Subject to any disclaimer, the term of this patent is extended or adjusted under 35 U.S.C. 154(b) by 735 days.

(21) Appl. No.: 12/690,263

(22) Filed: Jan. 20, 2010

(65) Prior Publication Data

US 2010/0188613 A1 Jul. 29, 2010

(30) Foreign Application Priority Data

Jan. 26, 2009 (JP) ................. P2009-014627

(51) Int. Cl.
*G02F 1/1335* (2006.01)
*B29C 67/24* (2006.01)
*F21V 8/00* (2006.01)
*H05B 33/14* (2006.01)
*H01L 33/50* (2010.01)

(52) U.S. Cl.
CPC ............. *B29C 67/24* (2013.01); *G02B 6/0055* (2013.01); *G02F 1/133615* (2013.01); *G02B 2207/113* (2013.01); *G02F 2001/133614* (2013.01); *G02B 6/0023* (2013.01); *G02F 1/133603* (2013.01); *G02F 1/133606* (2013.01); *G02F 1/133617* (2013.01); *H01L 33/507* (2013.01); *H01L 2933/0041* (2013.01); *H05B 33/14* (2013.01); *H01L 2224/48091* (2013.01); *H01L 2224/48247* (2013.01); *H01L 2224/48257* (2013.01)

(58) Field of Classification Search
CPC .. G02B 6/0068; G02B 6/0033; G02B 6/0055; G02B 2207/113; G02F 1/133615; G02F 2001/133614
USPC .................. 349/69–71, 65; 313/501
See application file for complete search history.

(56) References Cited

U.S. PATENT DOCUMENTS

| | | | |
|---|---|---|---|
| 6,637,905 B1 * | 10/2003 | Ng et al. | 362/601 |
| 2002/0079837 A1 * | 6/2002 | Okazaki | 313/512 |
| 2003/0067436 A1 * | 4/2003 | Hara et al. | 345/102 |
| 2005/0073495 A1 * | 4/2005 | Harbers et al. | 345/102 |
| 2005/0212397 A1 * | 9/2005 | Murazaki et al. | 313/487 |
| 2006/0255711 A1 * | 11/2006 | Dejima et al. | 313/485 |
| 2008/0164805 A1 * | 7/2008 | Song et al. | 313/495 |

(Continued)

FOREIGN PATENT DOCUMENTS

| | | |
|---|---|---|
| JP | A-11-087784 | 3/1999 |
| JP | A-2000-223749 | 8/2000 |

(Continued)

OTHER PUBLICATIONS

Japanese Patent Office, Notification of Reason(s) for Refusal mailed Feb. 19, 2013 in Japanese Patent Application No. 2009-014627 w/English-language Translation.

*Primary Examiner* — Michael Caley
(74) *Attorney, Agent, or Firm* — Oliff PLC

(57) ABSTRACT

A color converting member is capable of suppressing deterioration in a phosphor by a simple manufacturing process. A method of manufacturing a color converting member includes a process of molding a resin material into a shape. In the process, molding the resin material and the phosphor integrally into a shape is performed, after kneading a phosphor that converts one color light to another color light into the resin material.

1 Claim, 9 Drawing Sheets

(56) References Cited

U.S. PATENT DOCUMENTS

| | | |
|---|---|---|
| 2008/0218662 A1* | 9/2008 | Toyama et al. .................. 349/69 |
| 2009/0034292 A1* | 2/2009 | Pokrovskiy et al. ........... 362/617 |
| 2009/0080215 A1* | 3/2009 | Anandan ....................... 362/606 |

FOREIGN PATENT DOCUMENTS

| | | |
|---|---|---|
| JP | A-2001-107036 | 4/2001 |
| JP | A-2002-076434 | 3/2002 |
| JP | A-2003-224304 | 8/2003 |
| JP | A-2003-292758 | 10/2003 |
| JP | A-2004-221163 | 8/2004 |
| JP | 2004-352928 | 12/2004 |
| JP | 2006-49657 | 2/2006 |
| JP | A-2006-108076 | 4/2006 |
| JP | A-2006-202533 | 8/2006 |
| JP | 2007-23267 | 2/2007 |
| WO | WO 98/40505 | 9/1998 |

* cited by examiner

US 9,001,288 B2

COLOR CONVERTING MEMBER, METHOD OF MANUFACTURING THE SAME, LIGHT EMITTING DEVICE, AND DISPLAY DEVICE

CROSS REFERENCES TO RELATED APPLICATIONS

The present application claims priority to Japanese Priority Patent Application JP 2009-014627 filed in the Japan Patent Office on Jan. 26, 2009, the entire content of which is hereby incorporated by reference

BACKGROUND

The present disclosure relates to a color converting member for performing color conversion by using a phosphor, a method of manufacturing the same, a light emitting device using the color converting member, and a display device.

Previously, a liquid crystal display (LCD) is used as a thin-type display device. In the liquid crystal display, a backlight for irradiating an entire liquid crystal panel from the back side is used. According to the structure of the backlight, liquid crystal displays may be broadly divided into the direct type and the edge light type. In the edge light type, a light emitting element is provided for a side face of a light guide plate provided on the entire face of a display region. Light which is incident from the side face of the light guide plate is made propagate and, after that, is extracted from the top face of the light guide plate. On the other hand, in the direct type, for example, by disposing a plurality of light emitting elements on a substrate, plane emission is performed as a whole.

As such a backlight, there is proposed a light emitting device realizing pseudo white light by providing a phosphor layer for performing color conversion on the light outgoing side of a blue light emitting diode as a light emitting element and mixing converted color light and blue light (refer to, for example, Japanese Unexamined Patent Application Publication Nos. 2006-49657, 2004-352928, and 2007-23267.

Concretely, in Japanese Unexamined Patent Application Publication No. 2006-49657, by potting resin mixed with a YAG phosphor on a GaN-based blue light emitting diode chip, a part of blue light is converted to yellow light in the phosphor layer, thereby obtaining white light.

However, such a phosphor layer is vulnerable to oxygen and moisture in atmosphere. There is a problem such that when the phosphor layer is exposed to oxygen, moisture, and the like, it deteriorates. The color conversion efficiency of the phosphor decreases, and light emission luminance and chromaticity of the light emitting device deteriorates. Such deterioration in the phosphor is conspicuous particularly under high-temperature high-humidity environments. In Japanese Unexamined Patent Application Publication No. 2004-352928, a method of applying a phosphor layer on an exterior cap that seals a blue light emitting diode and, after that, hermetically sealing the resultant in vacuum or inert atmosphere is used. In Japanese Unexamined Patent Application Publication No. 2007-23267, a method of sealing a phosphor layer by sandwiching it between two glass substrates is proposed. However, the methods of Japanese Unexamined Patent Application Publication Nos. 2004-352928 and 2007-23267 have a problem such that the manufacturing process is complicated.

It is therefore desirable to provide a color converting member capable of suppressing deterioration in a phosphor by a simple manufacturing process, a method of manufacturing the same, and a light emitting device and a display device each using the member

SUMMARY

A method of manufacturing a color converting member of an embodiment includes a process of molding a resin material into a shape. In the process, molding the resin material and the phosphor integrally into a shape, after kneading a phosphor that converts one color light to another color light into the resin material. In such a manner, a color converting member containing the phosphor is formed.

A color converting member of an embodiment contains a phosphor that converts one color light to another color light.

A light emitting device of an embodiment includes: a light source; and a color converting member containing a phosphor that converts one color light generated from the light source to another color light.

A display device of an embodiment includes: the light emitting device of an embodiment of the invention; and a display panel that displays an image by using light which passed through the color converting member of the light emitting device.

According to the color converting member, the light emitting device, and the display device of embodiments of the present invention, when one color light is incident on the color converting member, a part of the color light is converted to another color light by the phosphor contained in the color converting member. Consequently, the one color light which is not converted and the converted another color is mixed, and mixed color light goes out.

According to color converting member and the method of manufacturing the color converting member of embodiments, at the time of molding a resin material into a shape, a phosphor that converts one color light to another color light is kneaded in the resin material, so that the resin material and the phosphor may be integrally molded into a shape. Since the phosphor is contained so as to be dispersed in the color converting member, it is not easily exposed to oxygen or moisture. Since each of the particles of the phosphor is surrounded by the resin material and spread, in the case of using a plurality of kinds of phosphor materials, there is also an advantage such that occurrence of interaction among different phosphor materials is suppressed. Therefore, the phosphor sealing process of, for example, sandwiching a formed phosphor by glasses or the like in order to protect the phosphor from oxygen and moisture is unnecessary. Thus, deterioration in the phosphor is suppressed by a simple manufacturing process. According to the light emitting device and the display device of embodiments of the present invention, since the color converting member as described above is provided, deterioration in luminance and chromaticity is suppressed.

Other and further objects, features and advantages will appear more fully from the following description.

Additional features and advantages are described herein, and will be apparent from the following Detailed Description and the figures.

DETAILED DESCRIPTION

Figure 1:
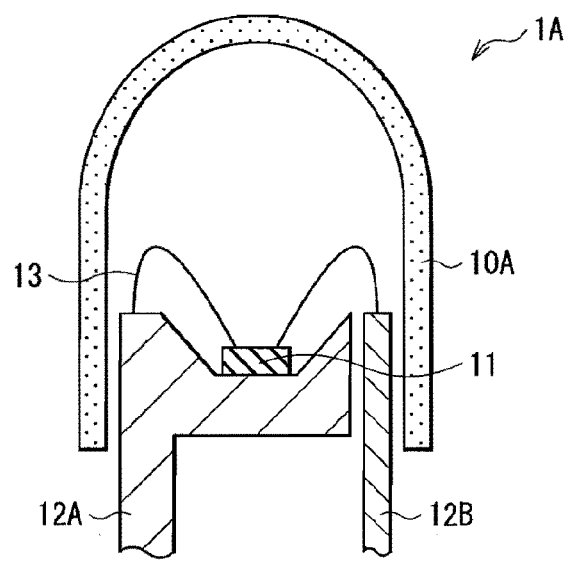
FIG. 1 is a schematic diagram illustrating a sectional configuration of a light emitting device according to a first embodiment.

Embodiments will be described in detail with reference to the drawings. Description will be given in the following order. In (2) to (9), the same reference numerals are designated to components similar to those of the first embodiment, and their description will not be repeated.

(1) First embodiment: example in which phosphor is contained in an exterior member of an LED (2) Modification 1: example in which a phosphor containing member is provided on the inside of the exterior member (3) Second embodiment: example of providing a phosphor containing sheet on the light outgoing side of a light source in which a plurality of LEDs are disposed on a substrate (4) Modification 2: example of providing a phosphor containing sheet between a diffusion film and a diffusion panel (5) Modification 3: example of making phosphor contained in the diffusion panel (6) Third embodiment: example of providing a phosphor containing sheet on the light outgoing face of a light guide plate (7) Modification 4: example of providing a phosphor containing sheet on the bottom face of the light guide plate (8) Modification 5: example of providing the phosphor containing sheet on a side face (light incidence face) of the light guide plate (9) Modification 6: example of making phosphor contained in the light guide plate itself

First Embodiment

FIG. 1 schematically illustrates a sectional configuration of a light emitting device 1A according to a first embodiment. The light emitting device 1A is used, for example, as a backlight of various lighting devices, a liquid crystal display (LCD), and the like. The light emitting device 1A has, as a light emitting element, for example, an LED (Light Emitting Diode) chip 11. The LED chip 11 is electrically connected to an anode frame 12A and a cathode frame 12B via wire bonding 13 and is entirely sealed with a phosphor containing cap 10A (color converting member). The LED chip 11 is, for example, a blue light emitting diode having a center wavelength in 400 nm to 500 nm.

The phosphor containing cap 10A is a package member for hermetically sealing the LED chip 11, and the shape of the appearance is a dome shape (hemispherical shape) having a curved surface. The phosphor containing cap 10A is made of, as a main material, a resin material A and contains a phosphor B (not shown in FIG. 1). From the viewpoints of transparency, workability, heat resistance property, and the like, examples of the resin material A include a thermoplastic resin such as polycarbonate (PC), polyethylene terephthalate (PET), polyethylene naphthalate (PEN), polyether sulfone (PES), or cyclic amorphous polyolefin, polyfunctional acrylate, polyfunctional polyolefin, unsaturated polyester, epoxy resin, and the like. In particular, a resin material whose deterioration caused by a blue light emitting diode or near-ultraviolet light emitting diode is small is preferable.

The phosphor B is contained in a state where it is spread in the phosphor containing cap 10A and is made of a material that converts incident color light to color light having a longer wavelength region. In the case of using, for example, a blue light emitting diode as the LED chip 11, the phosphor B is a phosphor containing at least one kind of a phosphor material which is excited by blue light and emits green light, red light, yellow light, or the like. Examples of a phosphor material of yellow conversion are $(Y,Gd)_3(Al,Ga)_5O_{12}:Ce^{3+}$ (commonly known as YAG:$Ce^{3+}$), and $\alpha$-SiAlON:$Eu^{2+}$, or the like. A phosphor material of yellow or green conversion is, for example, $(Ca,Sr,Ba)_2SiO_4:Eu^{2+}$, or the like. A phosphor material of green conversion is, for example, $SrGa_2S_4:Eu^{2+}$, $\beta$-SiAlON:$Eu^{2+}$, $Ca_3Sc_2Si_3O_{12}:Ce^{3+}$, or the like. A phosphor material of red conversion is, for example, $(Ca,Sr,Ba)S:Eu^{2+}$, $(Ca,Sr,Ba)_2Si_5N_8:Eu^{2+}$, $CaAlSiN_3:Eu^{2+}$, or the like. The phosphor B contains various phosphor materials at a proper compounding ratio.

For example, the phosphor containing cap 10A is manufactured by the following method. A general process of manufacturing a resin product such as plastic is broadly divided into a resin manufacturing process and a molding process. The resin manufacturing process is a process of performing chemical synthesis on a material and manufacturing a resin material for molding process. The molding process is classified into: a process (primary process) of molding the resin material obtained by the resin manufacturing process into a product shape by using various molding methods; and a process (secondary process) of performing processes such as adhesion, cutting, and coating on a primary-processed product.

In the embodiment, first, the resin material A as the above-described material is manufactured in the resin manufacturing process. After that, on the manufactured resin material A, as a preparation process for the next primary process, a process such as dehumidification, mixing, residual heat, or the like is performed. On the other hand, the phosphor B is formed by blending the above-described phosphor materials at a desired compounding ratio. Subsequently, in the primary process, at the time of molding the resin material A in a dome shape, the phosphor B is added. As a result, the phosphor containing cap 10A is obtained. Examples of the molding method include an injection molding method, an extruding method, a calendar molding method, an effusion method, a laminate forming method, a film forming method, a compression molding method, a transfer molding method, a baking method, a cast molding method, a blow molding method, an inflation molding method, a solution immersion molding method, a foam molding method, and a reactive injection molding method. For dome-shape molding as in the embodiment, it is desirable to use the injection molding method. In the following using the injection molding method as an example, the primary process will be described.

Figure 2:
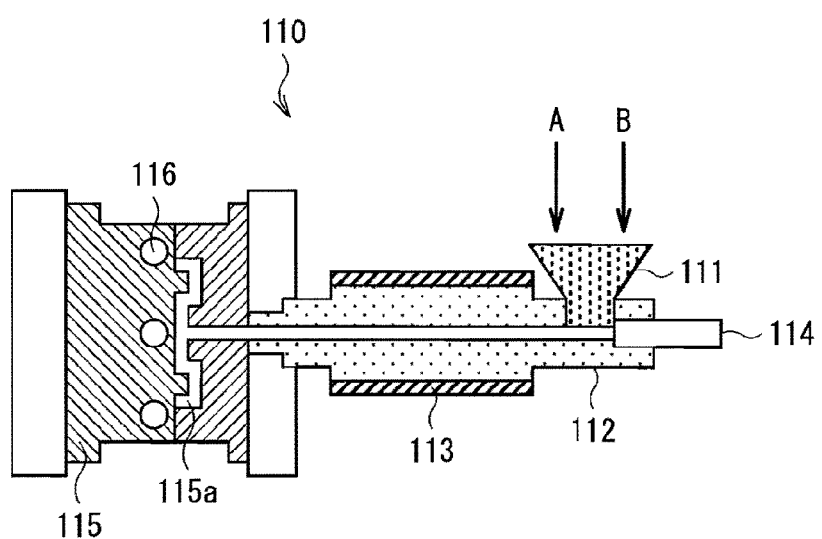
FIG. 2 is a schematic diagram illustrating a schematic configuration of an injection molding machine used in a process of forming a phosphor containing cap shown in FIG. 1.

FIG. 2 schematically illustrates a schematic configuration of an injection molding machine 110. The injection molding machine 110 has a hopper 111, a cylinder 112, a heater 113, a plunger 114, a mold 115 having a cavity 115a, and a cooler 116. At the time of molding, the resin material A and the phosphor B are kneaded and put in the hopper 111. In the injection molding machine 110, therefore, the kneaded resin material A and the phosphor B are supplied at a predetermined ratio into the cylinder 112 and heated by the heater 113. In the cylinder 112, the resin material A fluidizes (is softened) by plasticization. When a compound in the fluidized state is pressurized by the plunger 114, it is injected into the cavity 115a of the mold 115. The compound injected in the cavity 115a is cooled by the cooler 116 and solidified. By the operation, the compound is molded in a shape (in this case, a dome shape) corresponding to the shape of the mold 115. After that, the solidified compound is taken out from the cavity 115a, thereby obtaining the phosphor containing cap 10A containing the phosphor B.

In the light emitting device 1A of the embodiment, when blue light emitted from the LED chip 11 is incident on the phosphor containing cap 10A, a part of the incident blue light passes through the phosphor B which is spread in the phosphor containing cap 10A. The blue light which passes through the phosphor B is converted to color of another wavelength region (for example, red light or green light) in accordance with the material of the phosphor B. That is, by mixture of the blue light which passes through the phosphor containing cap 10A without being color converted and color light which is converted by the phosphor B, for example, the resultant light becomes white light and is emitted as white light to the outside.

Particularly, by kneading the phosphor B into the resin material A at the time of molding the phosphor containing cap 10A, the resin material A and the phosphor B may be integrally formed. Since the phosphor B exists so as to be spread in the resin material A formed, the phosphor B is not easily exposed to oxygen or moisture. Since each of the particles of the phosphor B is surrounded by the resin material A and spread, in the case of using a plurality of kinds of phosphor materials, there is also an advantage such that occurrence of interaction among different phosphor materials is suppressed. Therefore, the phosphor sealing process of, for example, sandwiching a formed phosphor by glasses or the like in order to protect the phosphor from oxygen and moisture is made unnecessary. Thus, deterioration in the phosphor may be suppressed by a simple manufacturing process. In a light emitting device 1A, deterioration in emission luminance and chromaticity can be suppressed. In addition, since it is unnecessary to use expensive thin glass or a special protection film in order to protect the phosphor B from oxygen, moisture, and the like, the cost is low.

Accordingly, a sulfide material such as $(Ca,Sr)S:Eu^{2+}$ or $SrGa_2S_4:Eu^{2+}$, an oxysulfide, a complex phosphor obtained by coordinating various organic ligands in light emission ions, and the like vulnerable to moisture are also preferably used.

Figure 3:
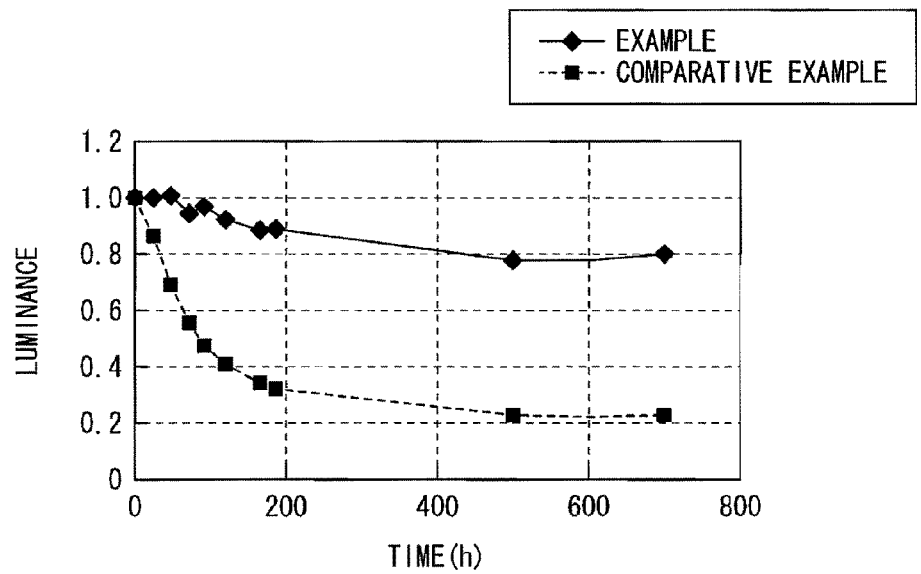
FIG. 3 is a diagram expressing changes in luminance with time in a phosphor containing resin according to the embodiment.

As an example of the embodiment, an experiment of manufacturing a resin material molded by kneading the phosphor B in the resin material A and measuring light emission luminance of the phosphor containing resin material was performed. FIG. 3 illustrates the result of the experiment. Blue light was used as incident light on the phosphor containing resin member, polycarbonate was used as the resin material A, and a phosphor material of green conversion whose luminance deterioration under high-temperature high-moisture environment is generally large was used as the phosphor B. The phosphor containing resin was left under high-temperature high-moisture environment of 85° C. and 90% RH and light emission luminance (whose initial value is set as 1) was measured every lapse time. As a comparative example of the example, a sample obtained by coating the surface of molded polyethylene terephthalate with a phosphor by using screen printing was produced and, in a manner similar to the example, changes with time in the light emission luminance were examined. In the example and the comparative example, the phosphors used were made of the same material, and the amount was the same.

As shown in FIG. 3, in the example of kneading the phosphor B in the resin material A and molding the resultant into a shape, as compared with the comparative example of applying the molded resin member with the phosphor, it is understood that decrease in the light emission luminance is smaller under the high-temperature high-humidity environment. It expresses that, under the high-temperature high-humidity environment, deterioration in the phosphor B in the example is suppressed. It is also understood that deterioration with time is smaller and a luminance fluctuation and a chromatic fluctuation caused by long-time use are also suppressed.

Modification 1

Figure 4:
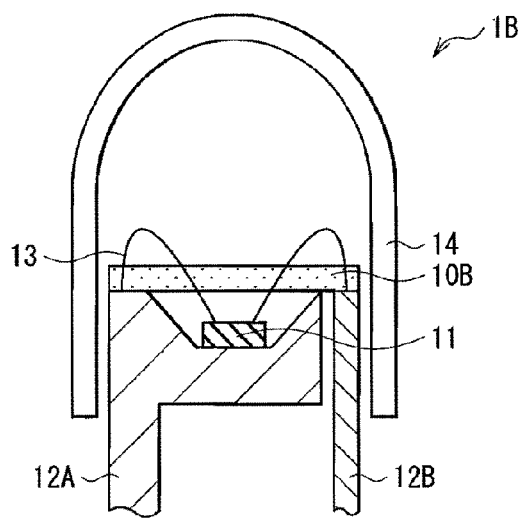
FIG. 4 is a schematic diagram illustrating a sectional configuration of a light emitting device according to modification 1.

FIG. 4 schematically illustrates a sectional configuration of a light emitting device 1B according to a modification (modification 1) of the first embodiment. The light emitting device 1B has, in a manner similar to the light emitting device 1A of the first embodiment, a plurality of LED chips 11 as light emitting elements. The LED chip 11 is electrically connected to the anode frame 12A and the cathode frame 12B via the wire bonding 13. In the modification, a phosphor containing plate 10B (color converting member) is disposed just above the LED chip 11, and the entire device is sealed with an exterior cap 14.

The phosphor containing plate 10B is a plate-shaped member disposed just above the LED chip 11 and apart from the LED chip 11 on the inside of the exterior cap 14. In a manner similar to the foregoing first embodiment, the phosphor containing plate 10B uses the resin material A as a main material and contains the phosphor B in a dispersed state. The phosphor containing plate 10B may be fabricated by using a molding method similar to that of the phosphor containing cap 10A of the first embodiment. At the time of molding a plane shape as in the modification, it is desirable to use the extruding molding method and the calendar molding method in the above-described primary process. The case of using the extruding molding method and the calendar molding method will be described below.

Figure 5:
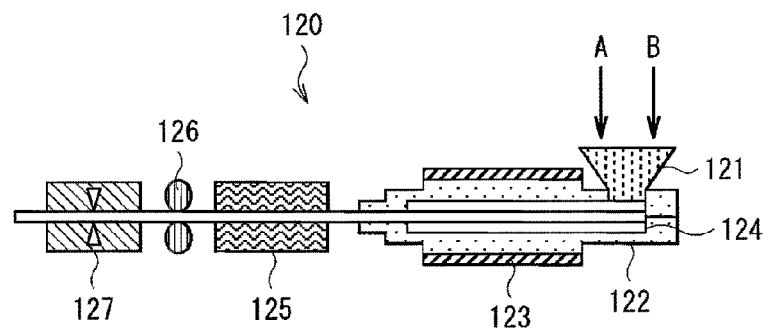
FIG. 5 is a schematic diagram illustrating a schematic configuration of an extruder used in the process of forming the phosphor containing cap shown in FIG. 1.

FIG. 5 schematically illustrates a schematic configuration of an extruder 120. The extruder 120 includes a hopper 121, a cylinder 122, a heater 123, a screw 124, a cooler 125, an extractor 126, and a cutter 127. In the case of performing molding by using the extruder 120, the resin material A and the phosphor B are kneaded and put in the hopper 121. A compound of the resin material A and the phosphor B becomes a fluidized state in the cylinder 122. The compound passes through the cooler 125, the extractor 126, and the cutter 127 to be extruded and molded in a desired mold shape. As a result, the phosphor containing cap 10A containing the phosphor B.

Figure 6:
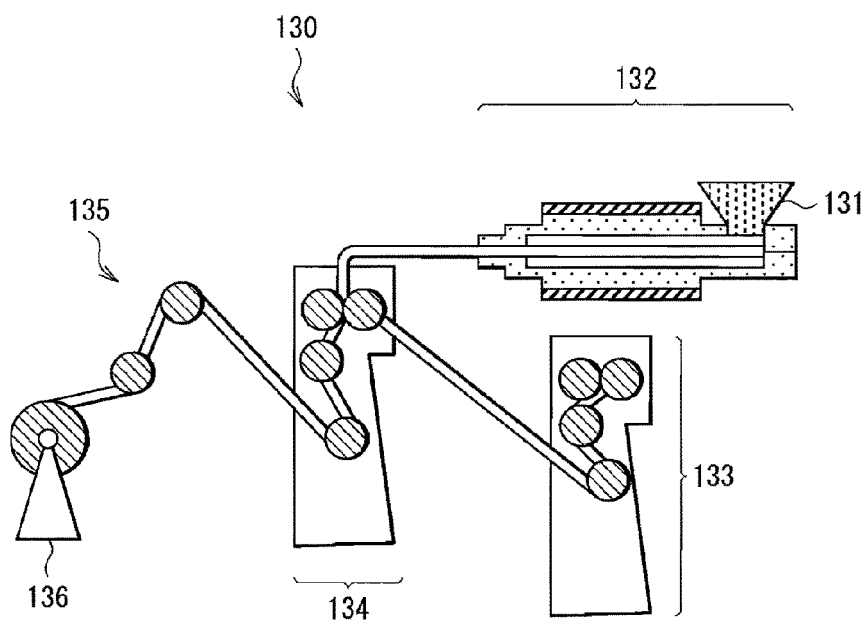
FIG. 6 is a schematic diagram illustrating a schematic configuration of a calendar used in the process of molding the phosphor containing cap shown in FIG. 1.

FIG. 6 schematically illustrates a schematic configuration of a calendar molding machine 130. The calendar molding machine 130 includes a hopper 131, an extruder 132, a kneading roll 133, a calendar roll 134, a cooler 135, and a take-up roll 136. In the case of performing molding by using the calendar molding machine, the resin material A and the phosphor B are kneaded and put in the hopper 131. A compound of the resin material A and the phosphor B is formed in the extruder 132, and the compound is passed through the calendar roll 134. It is also possible to form a compound of the resin material A and the phosphor B in the kneading roll 133 and, after that, make the compound pass through the calendar roll 134. The compound which passed through the calendar roll 134 passes through the cooler 135 and the take-up roll 136 and is formed in a desired shape. In such a manner, the phosphor containing cap 10A containing the phosphor B is obtained.

As described above, the phosphor containing plate 10B which contains the phosphor B may be disposed on the inside of the exterior cap 14. That is, in the light emitting device 1B in which the LED chip 11 is sealed with the exterior cap 14, a resin member containing the phosphor B as in the first embodiment is not limited to the exterior cap portion (the phosphor containing cap 10A). Even with the configuration of the light emitting device 1B of the modification, an effect similar to that of the light emitting device 1A of the first embodiment may be obtained. In the case where a plate-shaped member as in the modification is made contain a phosphor, as compared with the case where a dome-shaped member like in the first embodiment is made contain a phosphor, occurrence of color unevenness caused by luminance unevenness of the LED itself is suppressed.

Second Embodiment

Figure 7:
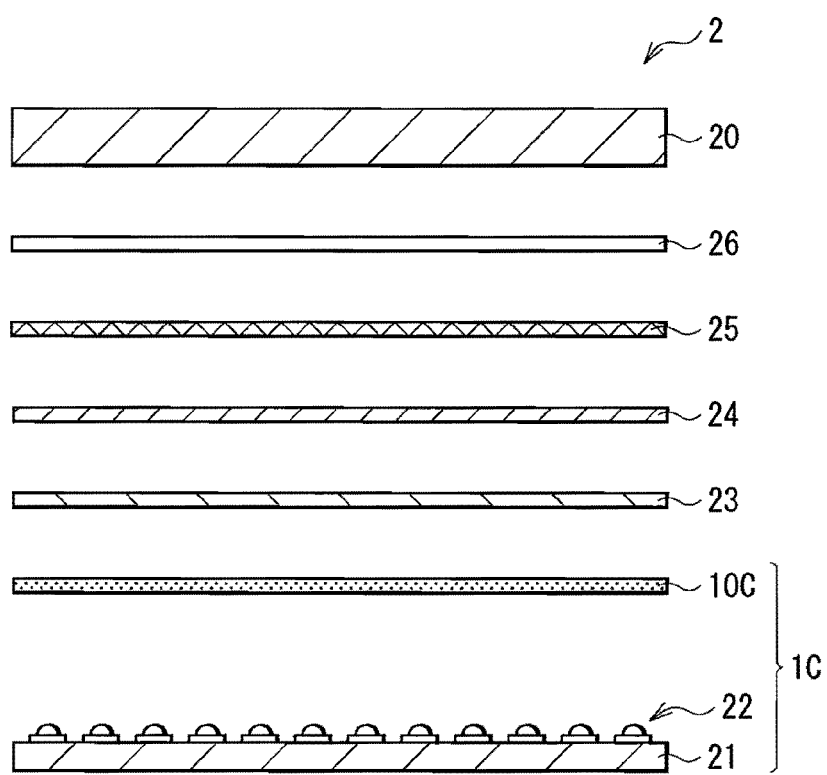
FIG. 7 is a schematic diagram illustrating a sectional configuration of a display device according to a second embodiment.

FIG. 7 is a schematic diagram illustrating a sectional configuration of a display device 2 according to a second embodiment. The display device 2 is, for example, a liquid crystal display and has a display panel 20 and a light emitting device 1C as a backlight. Between the display panel 20 and the light emitting device 1C, a diffusion plate 23, a diffusion film 24, a lens film 25, and a reflection-type polarizing film 26 are provided in order from the light emitting device 1C side.

The display panel 20 is obtained by, for example, sealing a liquid crystal layer between a TFT substrate on which a TFT (Thin Film Transistor) device, various drive circuits, a pixel electrode, and the like are formed and an opposed substrate on which a color filter, an opposed electrode, and the like are formed (those components are not shown). On the light incident side and the light outgoing side of the display panel 20, polarizers (not shown) are adhered so that their polarizing axes are orthogonal to each other.

The diffusion panel 23 and the diffusion film 24 are provided to diffuse incident light to make an intensity distribution uniform. The lens film 25 is obtained by, for example, arranging a plurality of prism-shaped (triangular prism shaped) projections in the same plane, and has the function of condensing incident light, for example, in the front direction. The reflection type polarizing film 26 is provided to transmit one of polarized light and reflect the other polarized light downward (to the side of the light emitting device 1C) to reuse it. The reflection type polarizing film 26 is provided to increase the light use efficiency.

The light emitting device 1C is obtained by disposing a plurality of LEDs 22 on the substrate 21. Just above the plurality of LEDs 22, a phosphor containing sheet 10C is provided so as to face the entire face of the LEDs 22. The LED 22 is, for example, blue light emitting diode. Like the phosphor containing cap 10A of the first embodiment, the phosphor containing sheet 10C uses, as the main material, the resin material A and contains the phosphor B in a dispersed state. In the embodiment, the phosphor containing sheet 10C is formed in a sheet shape. The phosphor containing sheet 10C is manufactured by using the various molding methods described in the foregoing first embodiment. In the embodiment as well, in a manner similar to the modification 1, it is desirable to use the extruding molding method and the calendar molding method in the primary process.

In the display device 2, when blue light emitted from the plurality of LEDs 22 is incident on the phosphor containing sheet 10C, a part of the incident blue light passes through the phosphor B dispersed in the phosphor containing sheet 10C. In a manner similar to the first embodiment, by color mixture of the blue light passed through the phosphor containing sheet 10C without being color-converted and color light subjected to the color conversion by the phosphor B, for example, white light emits upwards. The white light emitted from the light emitting device 1C is diffused by the diffusion panel 23 and the diffusion film 24, condensed by the lens film 25, passes through the reflection-type polarizing film 26, and is applied to the display panel 20. The irradiation light is modulated on the basis of image data in the display panel 20, thereby displaying an image. By providing the phosphor containing sheet 10C containing the phosphor B also in the light emitting device 1C of the embodiment, deterioration in the phosphor B is suppressed, and deterioration in emission light luminance and chromaticity is suppressed.

Modification 2

Figure 8:
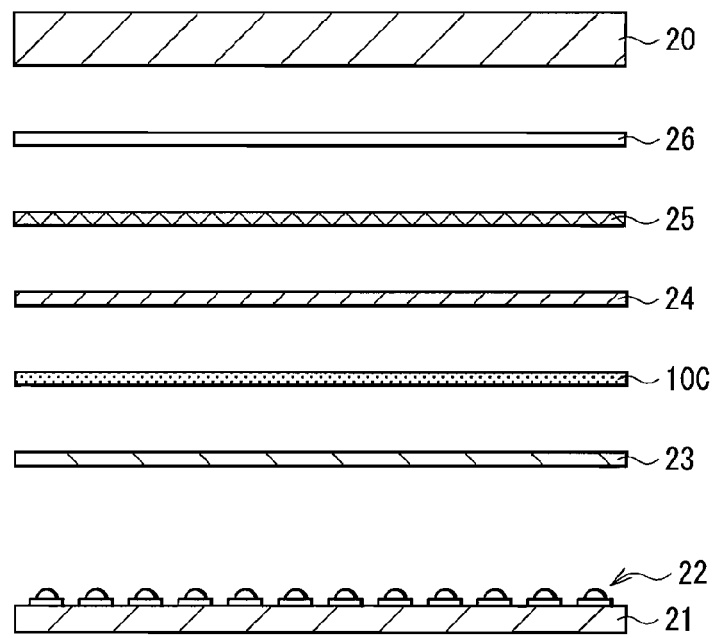
FIG. 8 is a schematic diagram illustrating a sectional configuration of a display device according to modification 2.

FIG. 8 schematically illustrates a sectional configuration of a display device according to a modification (modification 2) of the second embodiment. In the display device, between the diffusion plate 23 and the diffusion film 24 in the display device 2 of the second embodiment, the phosphor containing sheet 10C is disposed. Although the case of providing the phosphor containing sheet 10C just above the substrate 21 and the LEDs 22 has been described in the second embodiment, the place of disposing the phosphor containing sheet 10C is not limited to that in the second embodiment. As in the modification, the phosphor containing sheet 10C may be provided between the diffusion plate 23 and the diffusion film 24 or between the diffusion film 24 and the lens film 25. The phosphor containing sheet 10C may be disposed in any place as long as it is below the reflection-type polarizing film 26 where an optically large influence is not exerted.

Modification 3

Figure 9:
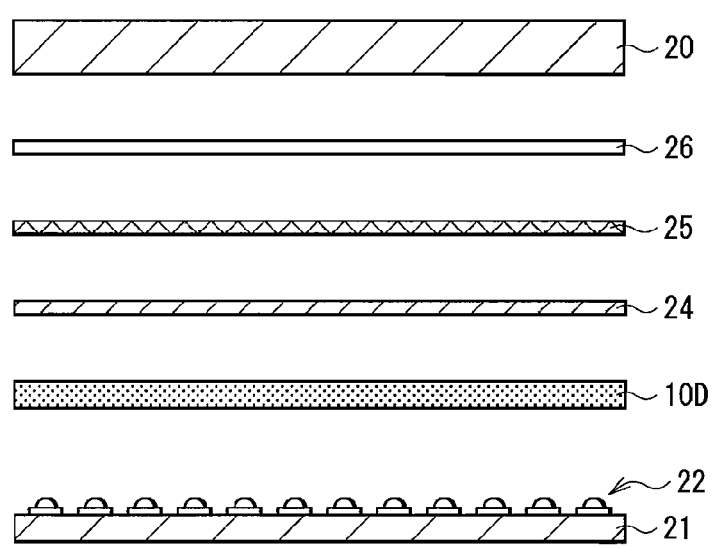
FIG. 9 is a schematic diagram illustrating a sectional configuration of a display device according to modification 3.

FIG. 9 schematically illustrates a sectional configuration of a display device according to a modification (modification 3) of the second embodiment. In the display device, a phosphor containing diffusion plate 10D is provided between the plurality of LEDs 22 and the diffusion film 24. The phosphor containing diffusion plate 10D is obtained by making a diffusion plate made of the resin material A as a main material contain the phosphor B and has both the light diffusing function and the color converting function. Such a phosphor containing diffusion plate 10D may be manufactured by using the various molding methods described in the first embodiment. Desirably, the extruding molding method and the injection molding method are used.

Like the phosphor containing diffusion plate 10D, the resin member containing the phosphor B may have other optical functions such as the light diffusing function. With the arrangement, effects similar to those of the second embodiment are obtained and, in the display device obtained by stacking optical function layers, the number of parts may be decreased. In the modification, the phosphor containing diffusion plate 10D having the light diffusing function by making the diffusion plate contain the phosphor B has been described. However, the invention is not limited to the modification, and the lens film may contain the phosphor B. That is, a phosphor containing lens film having a light condensing function may be used. As the light emitting device, a device in which a phosphor containing diffusion plate having the light diffusion function and a phosphor containing lens film having the light condensing function are provided above the plurality of LEDs 22 may be used.

Third Embodiment

Figure 10A:
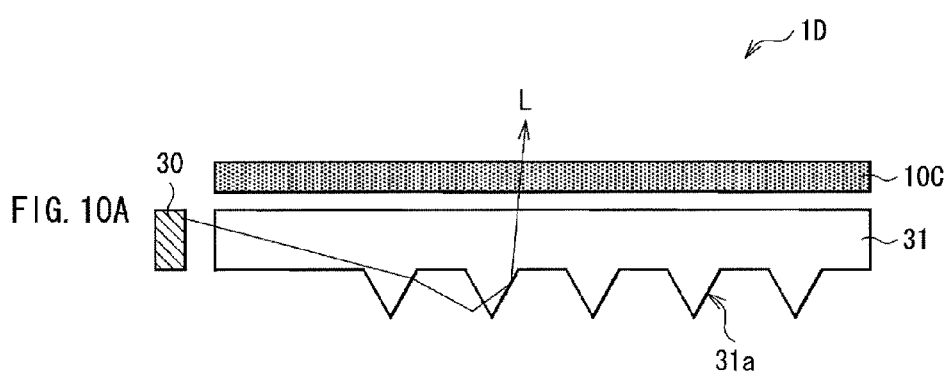
FIGS. 10A and 10B are schematic diagrams each illustrating a sectional configuration of a light emitting device according to a third embodiment.

FIG. 10A schematically illustrates a sectional configuration of a light emitting device 1D according to a third embodiment of the invention. The light emitting device 1D is used as, for example, a backlight of a liquid crystal display or the like. The light emitting device 1D is obtained by disposing an LED 30 on a side face of a light guide plate 31 and performs plane emission by making light emitted from the LED 30 propagate in the light guide plate 31 by total reflection and extracting it upward. On the top face (light outgoing face) of the light guide plate 31, the phosphor containing sheet 10C described in the second embodiment is provided. The LED is, for example, a blue light emitting diode.

In the bottom of the light guide plate 31 (the surface facing the light outputting face), for example a plurality of grooves 31a are formed as a process for light extraction. By the grooves 31a, the total reflection condition of the light propagating in the light guide plate 31 is made unsatisfied (the angle becomes less than the critical angle). The light goes out from the top of the light guide plate 31.

In the embodiment, when blue light emitted from the LED 30 enters the inside of the light guide plate 31, the blue light propagates in the light guide plate 31 by total reflection and goes out upward from the light guide plate 31 by the groove 31a. The blue light emitted from the light guide plate 31 enters the phosphor containing sheet 10C and a part of the light is color-converted by the phosphor B contained in the phosphor containing sheet 10C. With the arrangement, by color mixture of the blue light passed through the phosphor containing sheet 10C without being color-converted and color light subjected to the color conversion by the phosphor B, for example, white light emits upwards. As described above, the phosphor containing sheet 10C that contains the phosphor B may be provided on the light outgoing side of the light guide plate 31. In such a case as well, by suppression of deterioration in the phosphor B, deterioration in emission light luminance and chromaticity is suppressed.

Figure 10B:
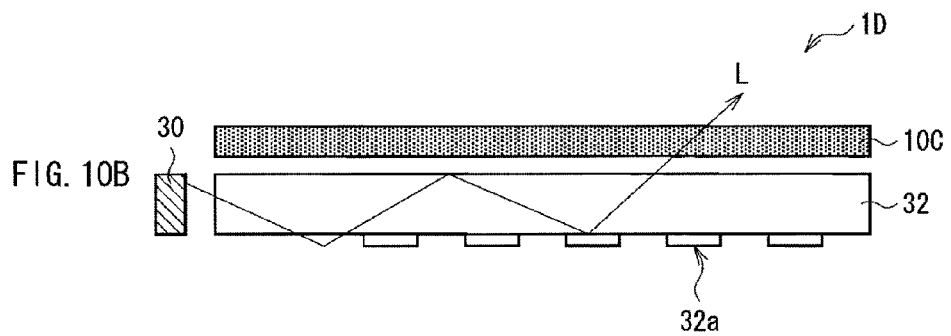

The light extracting process in the light guide plate 31 is not limited to the groove 31a as described above. For example, as shown in FIG. 10B, a light guide plate 32 in which a plurality of dots 32a are printed on the bottom may be used.

Modification 4

Figure 11A:
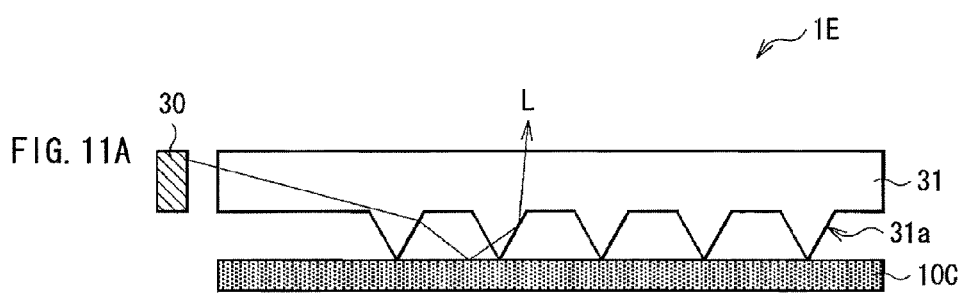
FIGS. 11A and 11B are schematic diagrams each illustrating a sectional configuration of a light emitting device according to modification 4.

FIG. 11A schematically illustrates a sectional configuration of a light emitting device 1E according to a modification (modification 4) of the third embodiment. In the modification, in a manner similar to the third embodiment, the LED 30 is disposed on the side of the light guide plate 31 and a plurality of grooves 31a are formed in the bottom side of the light guide plate 31. In the modification, the bottom side of the light guide plate 31 is provided with the phosphor containing sheet 10C.

In the modification, in the case where the total reflection condition is made unsatisfied by the groove 31a, when blue light passes through the phosphor B contained in the phosphor containing sheet 10C, color conversion is performed, and the resultant light is emitted upward of the light guide plate 31. Therefore, white light is extracted by the color mixture from the top of the light guide plate 31.

Figure 11B:
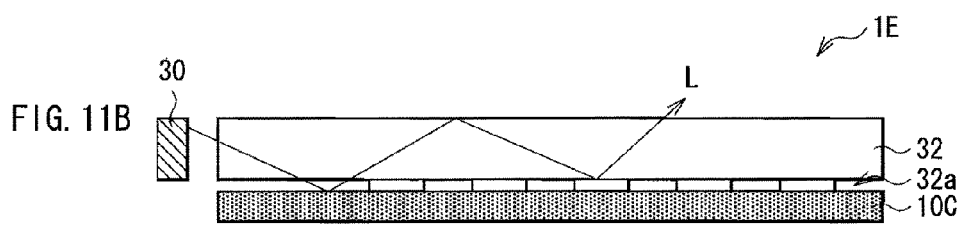

As described above, the phosphor containing sheet 10C may be provided at the bottom of the light guide plate 31. In this case as well, effects similar to those of the third embodiment are obtained. In the modification as well, the light extracting process is not limited to the groove 31a and, as shown in FIG. 11B, a configuration in which the dots 32a are printed on the bottom of the light guide plate 32 may be employed.

Modification 5

Figure 12A:
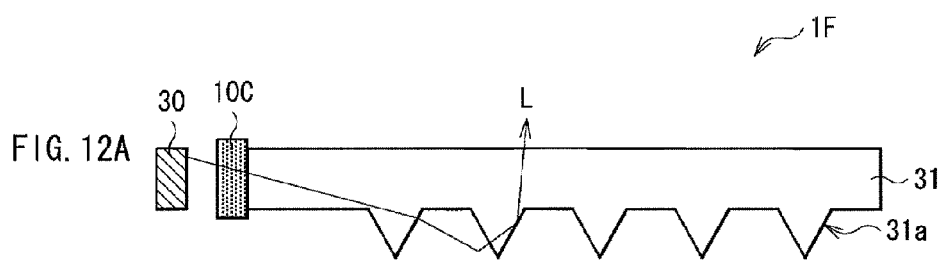
FIGS. 12A and 12B are schematic diagrams each illustrating a sectional configuration of a light emitting device according to modification 5.

FIG. 12A schematically illustrates a sectional configuration of a light emitting device 1F according to a modification (modification 5) of the third embodiment. In the modification, in a manner similar to the third embodiment, the LED 30 is disposed on the side of the light guide plate 31 and a plurality of grooves 31a are formed in the bottom side of the light guide plate 31. In the modification, the light incident face (the face on which the LEDs 30 are disposed) of the light guide plate 31 is provided with the phosphor containing sheet 10C. In the modification, a part of the blue light emitted from the LED 30 is subjected to color conversion before it enters the light guide plate 31. The color light obtained by the color conversion and the blue light propagates in the light guide plate 31 and, after that, goes upward of the light guide plate 31 by the groove 31a. Therefore, white light is extracted by the color mixture from the top of the light guide plate 31.

Figure 12B:
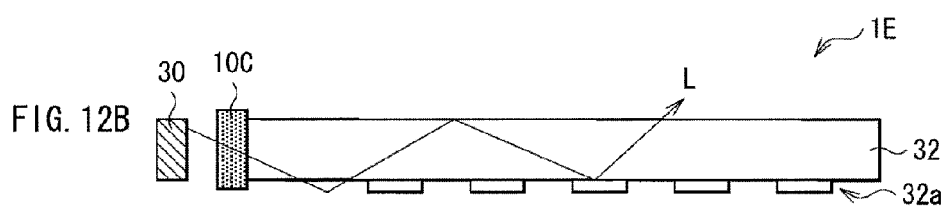

As described above, the phosphor containing sheet 10C may be provided on the light incident face of the light guide plate 31. In this case as well, effects similar to those of the third embodiment are obtained. In the modification as well, the light extracting process is not limited to the groove 31a and, as shown in FIG. 12B, a configuration in which the dots 32a are printed on the bottom of the light guide plate 32 may be employed.

Modification 6

Figure 13A:
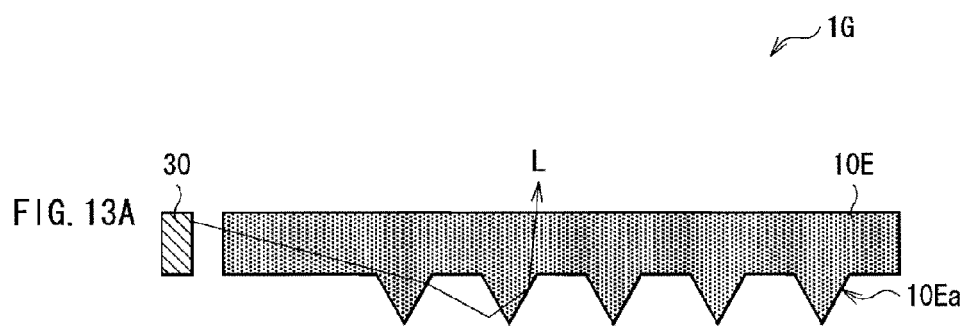
FIGS. 13A and 13B are schematic diagrams each illustrating a sectional configuration of a light emitting device according to modification 6.

FIG. 13A schematically illustrates a sectional configuration of a light emitting device 1G according to a modification (modification 6) of the third embodiment. In the modification, in a manner similar to the third embodiment, a light guide plate in which the LED 30 is provided on the side face is provided. In the modification, as the light guide plate, a phosphor containing light guide plate 10E is used. The phosphor containing light guide plate 10E is a light guide plate made of the resin material A as a main material and containing the phosphor B. A plurality of grooves 10Ea are formed in the bottom face of the phosphor containing light guide plate 10E. The phosphor containing light guide plate 10E is manufactured by using the various molding methods described in the foregoing first embodiment. Desirably, the calendar molding method, the extruding molding method, and the laminated plate molding method are used.

In the modification, when blue light emitted from the LED 30 is incident on the phosphor containing light guide plate 10E, the blue light propagates in the phosphor containing light guide plate 10E. The total reflection condition is made unsatisfied by the groove 10Ea, so that the blue light goes upward of the phosphor containing light guide plate 10E. In a process of passing through the phosphor containing light guide plate 10E, a part of blue light is color-converted by the phosphor B. Therefore, white light is extracted by color mixture from the top of the phosphor containing light guide plate 10E.

Figure 13B:
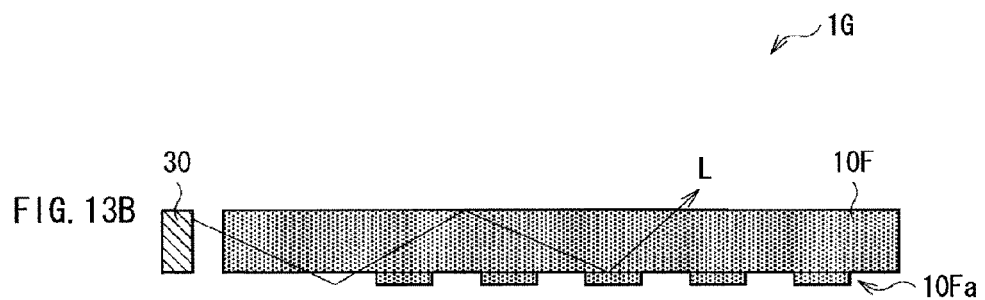

Like the phosphor containing light guide plate 10E, a configuration that the phosphor B is contained in a light guide plate itself may be also employed. In this case as well, effects similar to those of the third embodiment are obtained. In the modification as well, the light extracting process is not limited to the groove 10Ea. As shown in FIG. 13B, a configuration that dots 10Fa are printed on the bottom of the phosphor containing light guide plate 10F may be also employed.

Although the embodiments of the present invention have been described above, the invention is not limited to the embodiments and the like but may be variously modified. For example, although the configuration using the blue light emitting diode as the LED has been described above, the invention is not limited to the configuration. A light source that emits color light having a relatively short wavelength region, for example, a near-ultraviolet light emitting diode may be used. In this case, for the phosphor B, as a green-conversion or yellow-conversion phosphor material, $(Ca,Sr,Ba)_2SiO_4:Eu^{2+}$, $BAM:Eu^{2+}, Mn^{2+}$, $\alpha\text{-SiAlON:Eu}^{2+}$, and the like may be used. As phosphor materials of red conversion, $Y_2O_2S:Eu^{3+}$, $La_2O_2S:Eu^{3+}$, $(Ca,Sr,Ba)_2Si_5N_8:Eu^{2+}$, $CaAlSiN_3:Eu^{2+}$, $LiEuW_2O_8$, $Ca(Eu,La)_4Si_3O_{13}$, $Eu_2W_2O_9$-based materials, $(La,Eu)_2W_3O_{12}$, $(Ca,Sr,Ba)_3MgSi_2O_8:Eu^{2+}, Mn^{2+}$, $CaTiO_3:Pr^{3+}, Bi^{3+}$, and the like may be used. As phosphor materials of blue conversion, $BAM:Eu^{2+}$, $(Ca,Sr,Ba)_5(PO_4)_3Cl:Eu^{2+}$, and the like may be used. From the viewpoints of light emission efficiency and weather resistance, it is preferable to use a blue light emitting diode.

In the foregoing embodiments, the method of using a thermoplastic resin as the resin material A, softening the resin by heating, and cooling it, thereby solidifying the resin into a desired shape has been described as an example. The invention is not limited to the thermoplastic resin, and a thermoset resin may be used. In the case of using a thermoset resin as the resin material A, it is sufficient to use a heating mold to heat the resin and solidify it into a desired shape.

Further, in the embodiments, the configuration using the liquid crystal display as the display device of an embodiment of the present invention has been described. However, the present invention is not limited to the liquid crystal display but may be applied to other display devices.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light emitting device comprising:
   a light source; and
   a color converting member containing a phosphor that converts one color light generated from the light source to another color light,
   wherein the light source has a light emitting element and a light guide plate of which a generated light generated by the light emitting element is made incident to a side face of the light guide plate and the generated light is propagated by inner reflection, and performs plane emission of the generated light on a light outgoing face different from a face opposed to the side face, and
   wherein a plurality of grooves are provided on a bottom facing the light outgoing face of the light guide plate, the bottom having a substantially flat surface, ridges of the groove protruding outwardly of the light guide plate from the substantially flat surface, and the generated light propagated in the light guide plate performs plane emission on the light outgoing face by means of the plurality of grooves to be unsatisfied a total reflection condition of the generated light,
   wherein the color converting member is provided below and at a distance from the substantially flat surface of the bottom facing the light outgoing face such that the substantially flat surface of the bottom is between the light outgoing face and the color converting member and a gap is between the substantially flat surface of the bottom and the color converting member,
   wherein the generated light, which went out from the bottom, is reflected by the color converting member and performs plane emission on the light outgoing face, and
   wherein the color converting member is a phosphor containing sheet in which phosphor is dispersed in a resin material.

* * * * *